US012604455B2

(12) United States Patent
Wu

(10) Patent No.: US 12,604,455 B2
(45) Date of Patent: Apr. 14, 2026

(54) SEMICONDUCTOR DEVICE AND A MANUFACTURING METHOD

(71) Applicant: ChangXin Memory Technologies, Inc., Hefei City (CN)

(72) Inventor: Ping-Heng Wu, Hefei City (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 938 days.

(21) Appl. No.: 17/420,125

(22) PCT Filed: Nov. 17, 2020

(86) PCT No.: PCT/CN2020/129374
§ 371 (c)(1),
(2) Date: Mar. 23, 2023

(87) PCT Pub. No.: WO2021/115042
PCT Pub. Date: Jun. 17, 2021

(65) Prior Publication Data
US 2022/0157830 A1     May 19, 2022

(30) Foreign Application Priority Data

Dec. 10, 2019    (CN) .......................... 201911257093.5
Dec. 10, 2019    (CN) .......................... 201922203603.2

(51) Int. Cl.
*H10B 12/00*     (2023.01)

(52) U.S. Cl.
CPC ............. *H10B 12/09* (2023.02); *H10B 12/50* (2023.02)

(58) Field of Classification Search
CPC .... H10B 12/053; H10B 12/488; H10B 12/09; H10B 12/30; H10B 12/50
See application file for complete search history.

(56) References Cited

U.S. PATENT DOCUMENTS

| | | | |
|---|---|---|---|
| 5,502,320 A | 3/1996 | Yamada | |
| 2005/0151206 A1 | 7/2005 | Schwerin | |
| (Continued) | | | |

FOREIGN PATENT DOCUMENTS

| | | | |
|---|---|---|---|
| CN | 101234919 A | 8/2008 | |
| CN | 104086316 A | 10/2014 | |
| (Continued) | | | |

OTHER PUBLICATIONS

PCT/CN2019/19374 International Search Report mailed Oct. 10, 2019, English Translation.

(Continued)

*Primary Examiner* — Edward Chin
(74) *Attorney, Agent, or Firm* — Kilpatrick Townsend & Stockton LLP

(57)     ABSTRACT

A semiconductor device manufacturing method includes: providing a substrate having a memory cell array area; forming a word line trench; forming a word line conductive layer in the word line trench; forming a photoresist on the substrate surface, and patterning it to protect the word line conductive layer in the contact areas but exposes the word line conductive layer outside the word line contact area, and etching the conductive layer. The resulting thickness of the word line conductive structure in the word line contact area is greater than outside the word line contact area. Thereby the opening of the word line contact hole is reduced. The depth of the window position reduces the process time in forming the contact hole, which reduces the excessive erosion of the sidewalls of contact hole having a shallower opening depth, so to avoid the device short circuit.

9 Claims, 12 Drawing Sheets

(56) References Cited

U.S. PATENT DOCUMENTS

| | | | | |
|---|---|---|---|---|
| 2008/0048333 A1* | 2/2008 | Seo | ...................... | H10B 12/488 |
| | | | | 438/618 |
| 2022/0157830 A1* | 5/2022 | Wu | ........................ | H10B 12/09 |

FOREIGN PATENT DOCUMENTS

| | | | |
|---|---|---|---|
| CN | 105294321 | A | 2/2016 |
| CN | 106518468 | A | 3/2017 |
| CN | 106748426 | A | 5/2017 |
| CN | 211017077 | U | 7/2020 |
| CN | 211350646 | U | 8/2020 |
| CN | 116133432 | A | 5/2023 |
| JP | 2010165849 | A | 7/2010 |
| KR | 2012-0132264 | A | 12/2012 |
| WO | WO 2021/128316 | A1 | 1/2021 |

OTHER PUBLICATIONS

PCT/CN2019/19374 Written Opinion by the International Searching Authority mailed Oct. 10, 2020.

PCT/CN2019/129374 International Search Report mailed Oct. 10, 2019, English Translation.

PCT/CN2019/129374 Written Opinion by the International Searching Authority mailed Oct. 10, 2020.

EP 20898273.6 Extended European Search Report mailed Dec. 12, 2022.

State Intellectual Property Office of the People's Republic of China, Office Action and Search Report Issued in Application No. 201911257093.5, Aug. 18, 2024, 9 pages.

* cited by examiner

S102 Provide a substrate

S104 Form a word line trench

S106 Form a word line conductive layer

S108 Deposit photoresist

S110 Pattern a word line conductive structure

S112 Remove photoresist

SEMICONDUCTOR DEVICE AND A MANUFACTURING METHOD

CROSS REFERENCES TO RELATED APPLICATIONS

This application is a national phase entry of International Application No. PCT/CN2019/129374 filed on Nov. 17, 2020 which claims the benefit of priority to CN Patent Application CN 201911257093.5 and CN201922203603.2 both filed on Oct. 12, 2019, all entitled "A Semiconductor Device and A Manufacturing Method", the contents of which are incorporated herein by reference in its entirety.

TECHNICAL FIELD

The present disclosure relates to the field of semiconductor technology, in particular, to a semiconductor device and a manufacturing method of the semiconductor device.

BACKGROUND

When contact window structures are fabricated during making dynamic random access memory devices, contact hole preparing process faces challenges to make different contact window structures in the same process, because contact hole depths of different contact window structures are different. Using one process will have the problem of insufficient contact hole depth, such as when the contact hole has stopped on the surface of the source area, the deeper word line contact hole still stays above the word line conductive structure and has not yet completed the hole opening, but if continued with etching the word line contact hole, the source area contact hole may be etched to inside the active area, at the same time, the side wall of the contact hole may suffer from hole expansion due to sidewall etching, which is likely to cause the device feature size increase or short circuit abnormality.

SUMMARY

Based on above, it is necessary to provide a new method of manufacturing a semiconductor device and a new semiconductor device in response to the above-mentioned problems.

A method for manufacturing a semiconductor device, including: obtaining a substrate, the substrate includes a memory cell array area; forming spaced apart word line trenches in the memory cell array area; filling word line conductive material in the word line trenches to form a word line conductive layer; forming a photoresist on the surface of the substrate, the photoresist protecting the word line conductive layer at the word line contact area but exposing the word line conductive layer outside the word line contact area; using the photoresist as a barrier layer, the word line conductive layer that is not protected by the photoresist is etched to a target height to obtain a word line conductive structure, so that the thickness of the word line conductive structure of the word line contact is greater than the thickness of the word line conductive structure not protected by the photoresist; and then the photoresist is removed.

In one of the embodiments, the word line contact area is located at the end of the word line conductive structure.

In one of the embodiments, the thickness ratio of the word line conductive structure of the word line contact area to the word line conductive structure outside the contact area is greater than or equal to 1.5 and less than or equal to 4.0.

In one of the embodiments, after removing the photoresist, the method further includes: forming a first insulating dielectric layer on the surface of the substrate; patterning the first insulating dielectric layer, and a forming a word line contact hole in the word line contact area.

In one of the embodiments, the substrate further includes a peripheral circuit area, the peripheral circuit area includes a transistor active area, a second insulating dielectric layer is formed on the surface of the transistor active area, and the second insulating dielectric is patterned, and an active area contact hole is formed on the source area/drain area of the active area.

In one of the embodiments, the depth difference between the active area contact hole and the word line contact hole is greater than or equal to 0 and less than 20% of the depth of the active area contact hole.

in one of the embodiments, the word line contact hole and the active area contact hole are formed by the same process.

In one of the embodiments, the first insulating dielectric layer and the second insulating dielectric layer are formed by the same process.

In one of the embodiments, the semiconductor device is a dynamic random access memory.

The above manufacturing method includes: providing a substrate, the substrate includes a memory cell array area; forming spaced word line trenches in the memory cell array area; filling word line conductive material in the word line trenches, forming a word line conductive layer; forming a photoresist on the surface of the substrate, the photoresist protects the word line conductive layer at the word line contact area and exposes the word line conductive layer outside the word line contact area; the photoresist acts as a mask layer, and the word line conductive layer that is not protected by the photoresist is etched to a target depth to make a word line conductive structure, so that the thickness of the word line conductive structure at the word line contact area is greater than the thickness of the word line conductive structure outside the contact area. In this application, a photoresist is formed on the surface of the substrate. The photoresist covers the word line conductive layer at the word line contact area and exposes the word line conductive layer outside the word line contact area. Compared with when the thickness of two areas are the same, the opening of the word line contact hole in the word line contact area is reduced. The depth of the window position reduces the process time in forming the contact hole, reduces the excessive erosion of the sidewall of the contact hole having a shallower opening depth, therefore avoids the device short circuit caused by the abnormal contact hole.

According to another embodiment, a semiconductor device is provided, which includes: a substrate, a memory cell array area is formed on the substrate, and word line trenches arranged at intervals are formed in the memory cell array area; a word line conductive structure, the word line conductive structure includes a word line conductive structure in a word line contact area and a word line conductive structure outside the word line contact area, wherein, the thickness of the word line conductive structure of the word line contact area is greater than the thickness of the word line conductive structure outside the word line contact area.

In one of the embodiments, the word line contact area is located at the end of the word line conductive structure.

In one of the embodiments, the ratio of the thickness of the word line conductive structure of the word line contact area to the thickness of the word line conductive structure outside the word line contact area is greater than or equal to 1.5 and less than or equal to 4.0.

In one of the embodiments, the device further includes: a peripheral circuit area, the peripheral circuit area includes a transistor active area, and the active area has a source area/drain area; an insulating dielectric layer, the insulating dielectric layer is located on the surface of the word line conductive structure and the active area; a word line contact structure, the word line contact structure being located on the word line contact area and in contact with the word line contact area; the active area contact structure is located on the transistor active area and is in contact with the source area/drain area of the transistor active area.

In one of the embodiments, the depth difference between the active area contact structure and the word line contact structure is greater than or equal to 0 and less than 20% of the height of the active area contact structure.

In one of the embodiments, the active area contact structure and the word line contact structure are formed at the same time.

In one of the embodiments, the semiconductor device is a dynamic random access memory.

The semiconductor device described above includes a substrate on which a memory cell array region is formed, and the memory cell array region is formed with word line trenches arranged at intervals; a word line conductive structure, the word line conductive structure includes word line contacts, the conductive structure of the word line contact area and the conductive structure of the word line outside the word line contact area; wherein the thickness of the word line conductive structure of the word line contact area is greater than the thickness of the word line conductive structure outside the word line contact area. Compared with a device which has equal thickness of the word line conductive structure in and out of the contact area, the depth of the opening position of the word line contact hole is reduced, and the process time forming the contact hole is reduced. In the contact hole process, excessive erosion of the sidewall of the contact hole with a shallow opening depth is avoided, therefore the device short circuit caused by the abnormal contact hole is avoided.

BRIEF DESCRIPTION OF THE DRAWINGS

By describing its exemplary embodiments in detail with reference to the accompanying drawings, the above and other objectives, features and advantages of the present disclosure will become more apparent.

4

Figure 4A:
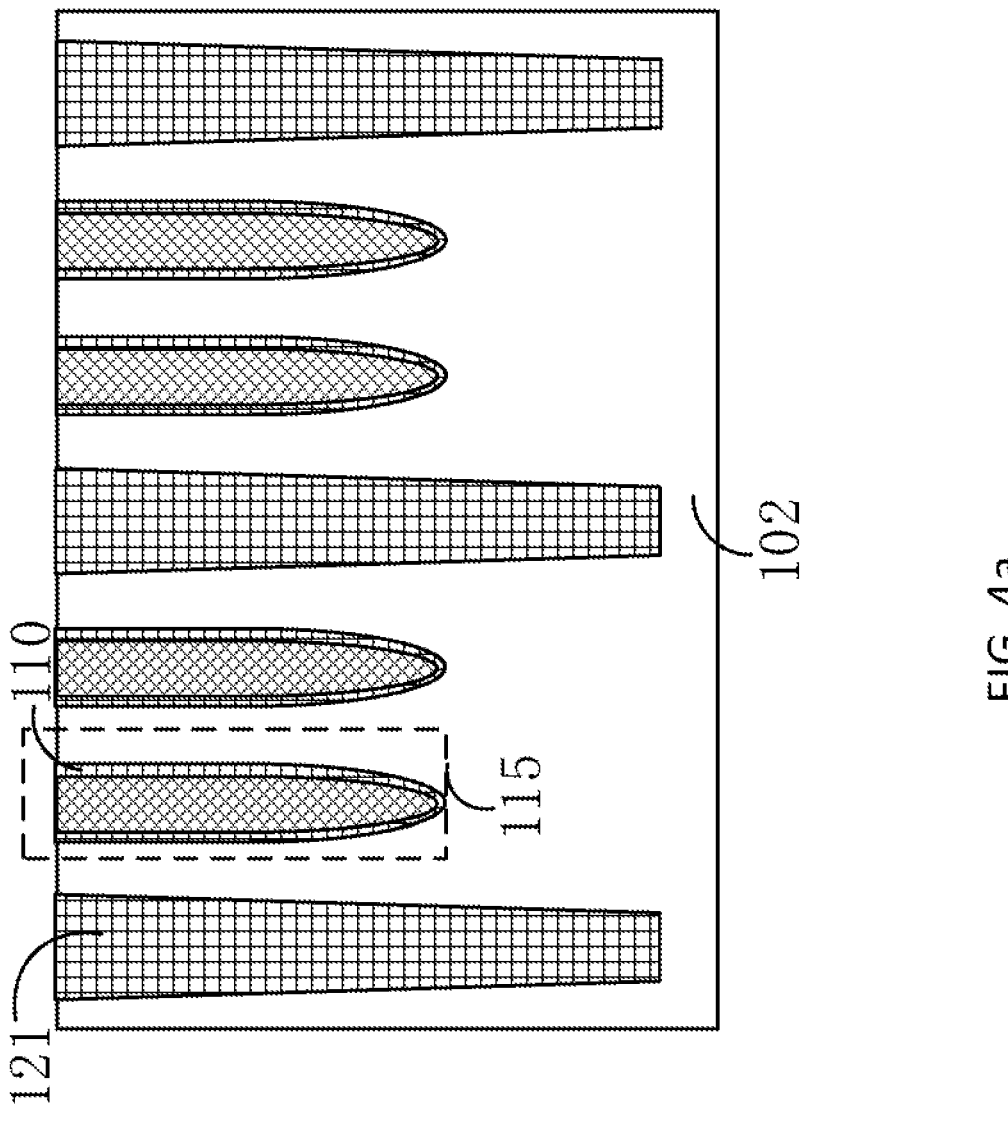
FIG. 4a is a cross-sectional view of the word line contact holes in a direction perpendicular to the word line conductive layer according to an embodiment.
Figure 4B:
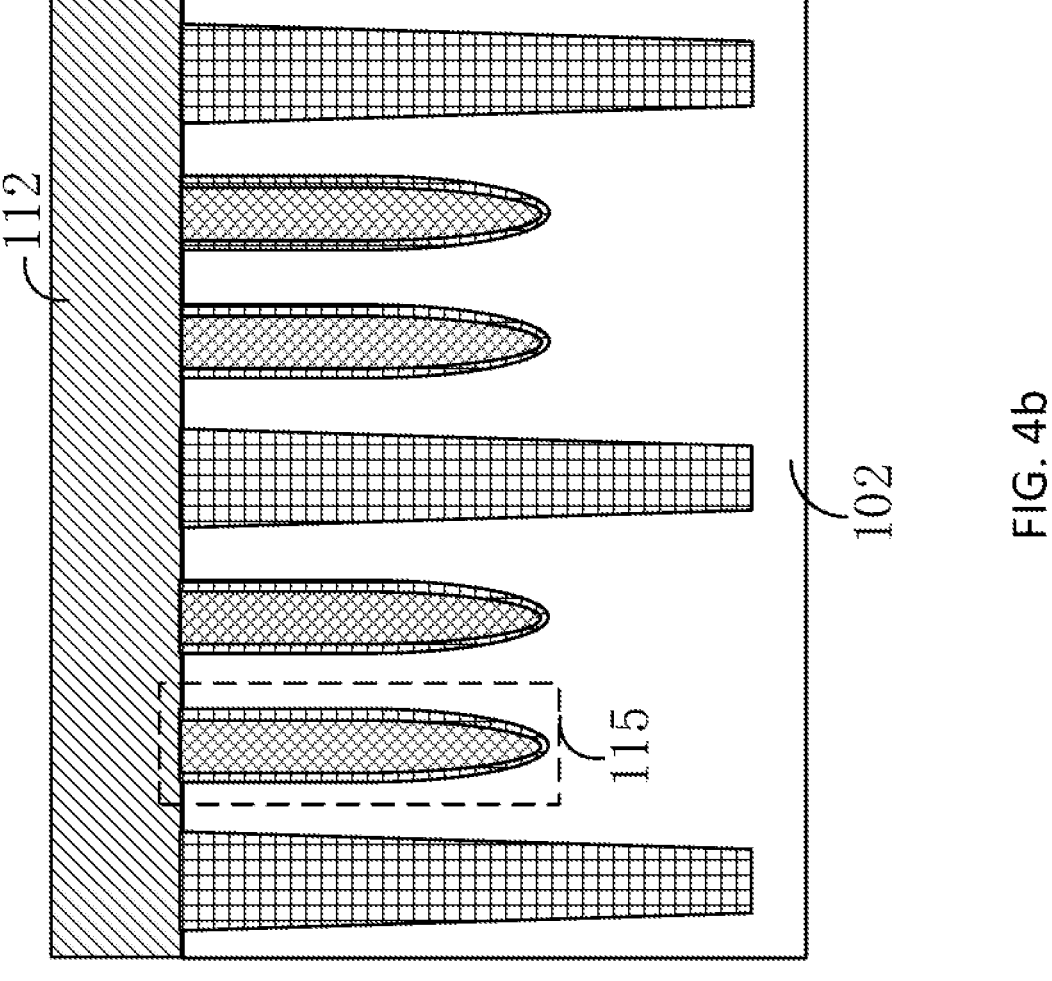
FIG. 4b is a cross-sectional view after the photoresist is formed on the structure of FIG. 4a according to an embodiment.
Figure 4C:
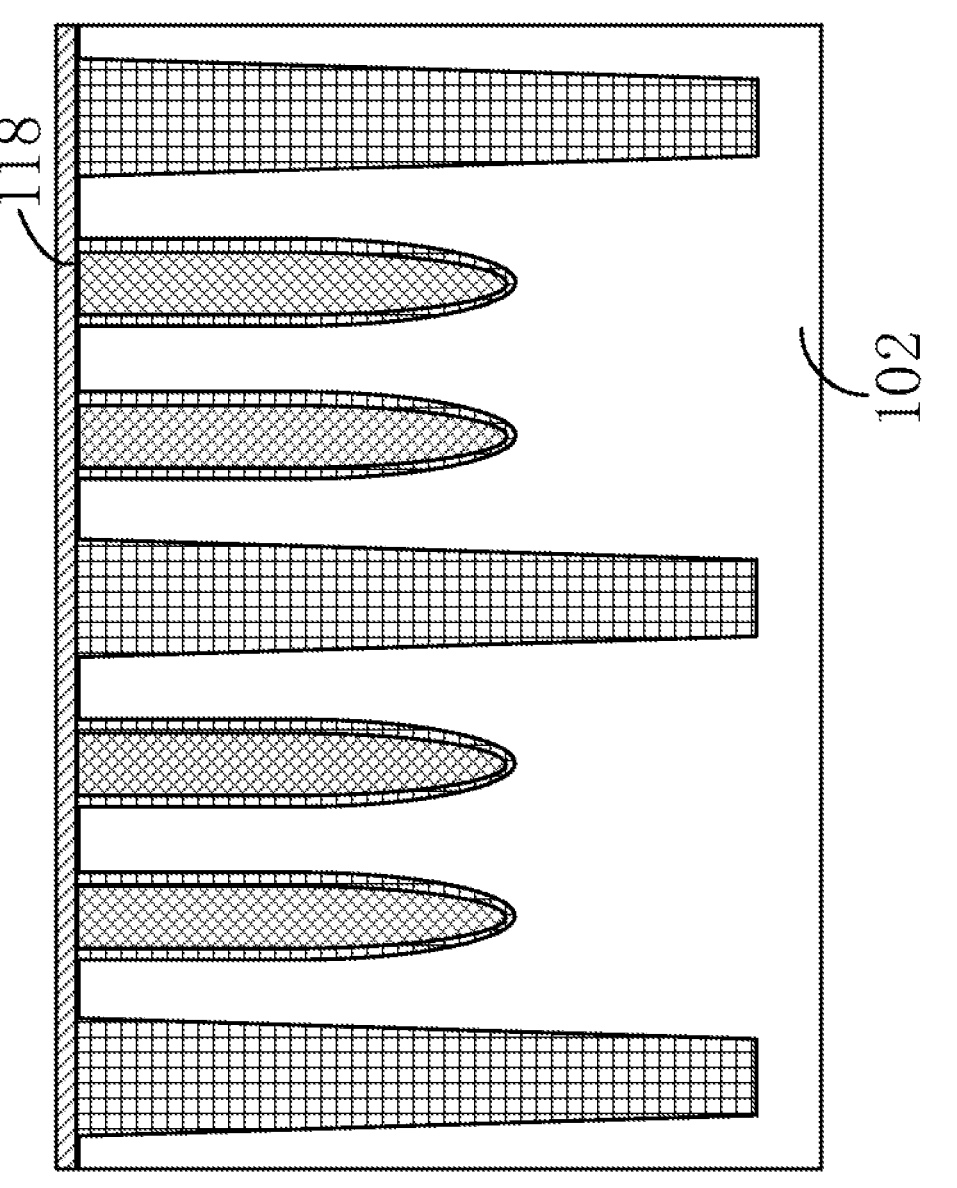
Figure 5A:
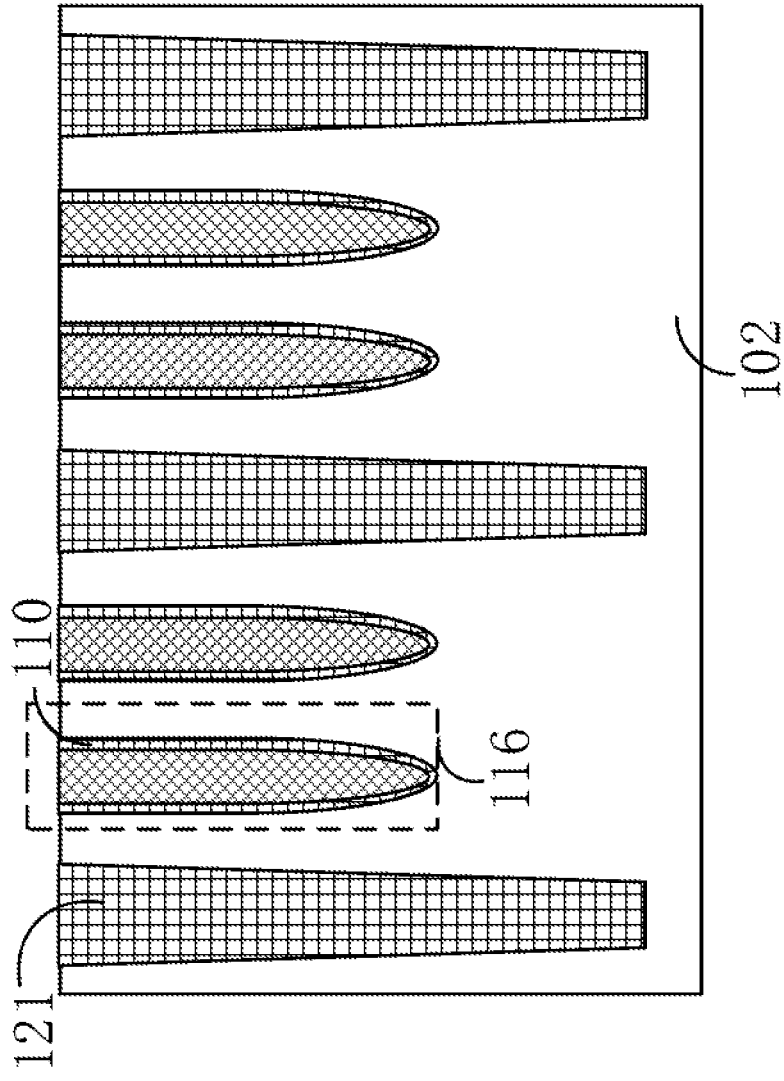
Figure 5B:
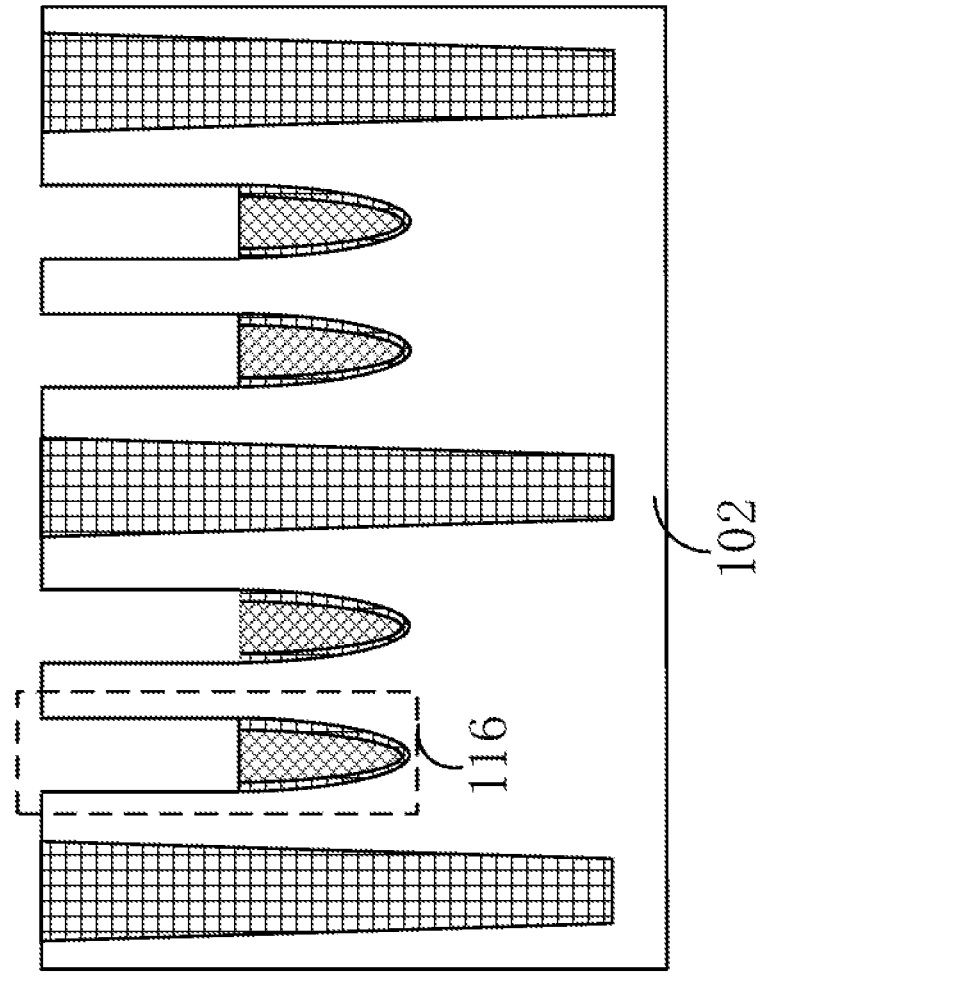
Figure 5C:
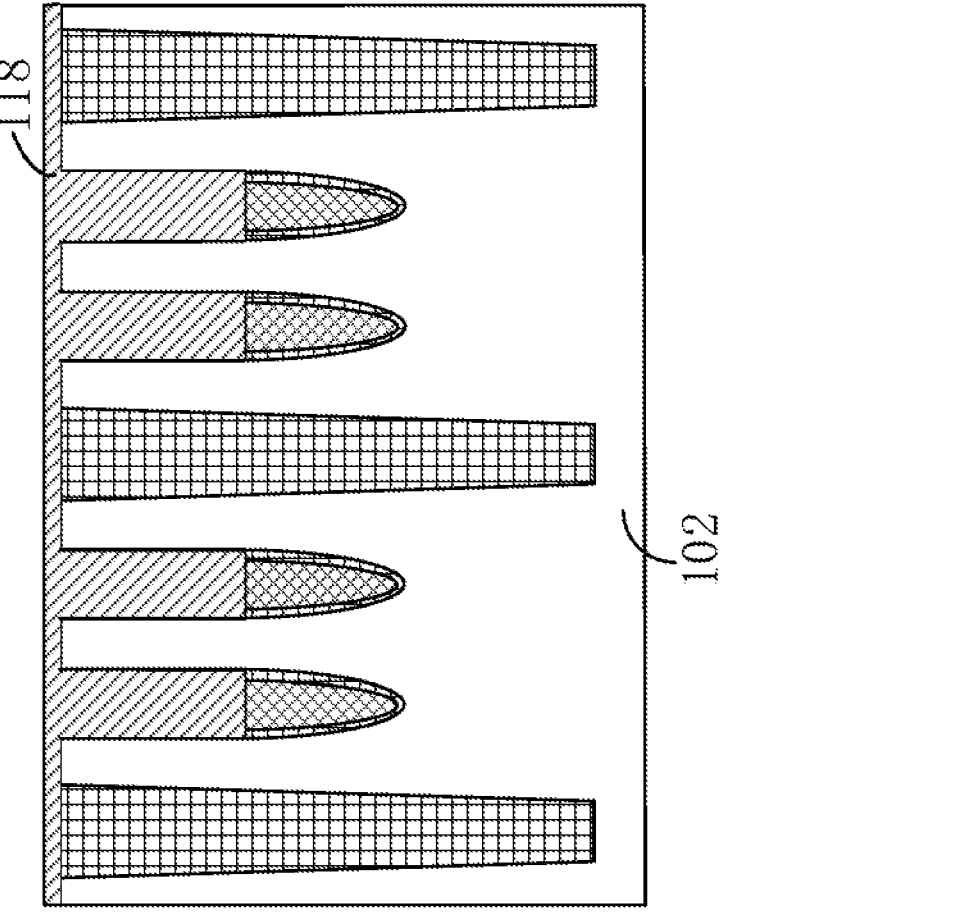

FIG. 4c is a cross-sectional view after the insulating dielectric layer is formed on the structure of FIG. 4b according to an embodiment;

FIG. 5a is a cross-sectional view of an area outside the word line contact holes in a direction perpendicular to the word line conductive layer according to an embodiment;

FIG. 5b is a cross-sectional view after the word line conductive structure is formed on the structure of FIG. 5a according to an embodiment; and FIG. 5c is a cross-sectional view after the insulating dielectric layer is formed on the structure of FIG. 5b according to an embodiment.

DETAILED DESCRIPTION OF THE PREFERRED EMBODIMENTS

In order to facilitate the understanding of the present disclosure, the present disclosure will be described more fully below with reference to the relevant drawings. The preferred embodiment of the present disclosure is shown in the drawings. However, the present disclosure can be implemented in many different forms and is not limited to the embodiments described herein. On the contrary, the purpose of providing these embodiments is to make the disclosure of the present disclosure more thorough and comprehensive.

Unless otherwise defined, all technical and scientific terms used herein have the same meaning as commonly understood by those skilled in the technical field of the present disclosure. The terms used in the description of the present disclosure herein are only for the purpose of describing specific embodiments, and are not intended to limit the present disclosure. The term "and/or" as used herein includes any and all combinations of one or more related listed items.

It should be understood that when an element or layer is referred to as being "on", "adjacent to", "connected to" or "coupled to" other elements or layers, it can be directly on the other elements or layers. On a layer, adjacent to, connected to, or coupled to other elements or layers, or intervening elements or layers may be present. In contrast, when an element is referred to as being "directly on", "directly adjacent to", "directly connected to" or "directly coupled to" other elements or layers, there are no intervening elements or layers. It should be understood that although the terms first, second, third, etc. may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teachings of the present disclosure, the first element, component, region, layer or section discussed below may be represented as a second element, component, region, layer or section.

Spatial relationship terms such as "under", "below", "below", "below", "above", "above", etc., in It can be used here for the convenience of description to describe the relationship between one element or feature shown in the figure and other elements or features. It should be understood that in addition to the orientations shown in the figures, the spatial relationship terms are intended to include different orientations of devices in use and operation. For example, if the device in the drawings is turned over, then elements or features described as "below" or "below" or "under" other elements will be oriented "on" the other elements or features. Therefore, the exemplary terms "below" and "below" can include both an orientation of above and below. The device can be otherwise oriented (rotated by 90 degrees or other orientations) and the spatial descriptors used here are interpreted accordingly.

The purpose of the terms used here is only to describe specific embodiments and not as a limitation of the present disclosure. When used herein, the singular forms of "a", "an" and "the/the" are also intended to include plural forms, unless the context clearly indicates otherwise. It should also be understood that the terms "composition" and/or "including", when used in this specification, determine the existence of the described features, integers, steps, operations, elements and/or components, but do not exclude one or more other The existence or addition of features, integers, steps, operations, elements, components, and/or groups. As used herein, the term "and/or" includes any and all combinations of related listed items.

The embodiments of the disclosure are described herewith reference to cross-sectional views which are schematic diagrams of ideal embodiments (and intermediate structures) of the disclosure. In this way, changes from the shown shape due to, for example, manufacturing technology and/or tolerances can be expected. Therefore, the embodiments of the present disclosure should not be limited to the specific shapes of the regions shown here, but include shape deviations due to, for example, manufacturing. For example, the implanted area shown as a rectangle usually has round or curved features and/or implant concentration gradients at its edges, rather than a binary change from an implanted area to a non-implanted area. Likewise, the buried region formed by the implantation can result in some implantation in the region between the buried region and the surface through which the implantation proceeds. Therefore, the regions shown in the figure are schematic in nature, and their shapes are not intended to show the actual shape of the regions of the device and are not intended to limit the scope of the present disclosure.

In a typical dynamic random access memory device, contact structures connect word lines, bit lines, source/drain regions of transistor active areas, and transistor gate regions, the corresponding contact holes should have openings target to different depths. When using the same process to prepare contact holes, it will appear that one contact hole has reached the corresponding target depth, but the other contact holes have not yet achieved full opening. At this time, continue to open the window although increases the contact hole depth, their sidewalls will continue to be expanded, which can easily enlarge the feature size of the device or induce short circuit abnormality from the side-etched device. For example, the active area contact (aka AA Contact) of the transistor may stop at the surface of the active area, but the deeper word line contact (WL Contact) still stays above the word line conductive structure and has not yet completed the full opening. If the etching continues, the transistor active area contact hole will be touching the inside of the active area, producing the spiking effect.

As shown in FIGS. 1, 3a-3c, 4a-4c, and 5a-5c, according to one embodiment, a method for manufacturing a semiconductor device includes steps of:

S102: providing a substrate.

The substrate 102 includes a memory cell array area. The substrate may be composed of one of silicon, silicon-on-insulator (SOI), stacked-silicon-on-insulator (SSOI), stacked-silicon-germanium-on-insulator (SSiGeOI), silicon-germanium-on-insulator (SiGeOI)) and germanium-on-insulator (GeOI) and other materials.

S104, forming a word line trench.

Word line trenches 104 (in at least FIG. 3b) arranged at intervals are formed in the memory cell array area. A plurality of mutually independent word line trenches are formed in the memory cell array area, and the word line trenches extend along a first direction and are arranged at intervals along a second direction. The first direction and the second direction intersect.

In one embodiment, the word line trenches are formed by dry etching. In another embodiment, the word line trenches are formed by wet etching.

In one embodiment, the word line trenches are formed by combining the two above processes.

S106, forming a word line conductive layer.

A word line conductive material is filled in the word line trenches 104 to form a word line conductive layer 108. In one embodiment, before forming the word line conductive layer 108, the process further includes forming an insulating layer 110 (FIG. 4a) on the inner wall of the word line trench 104, and the insulating layer 110 may be composed of a silicon dioxide film layer.

In an embodiment, before filling the word line conductive material in the word line trenches 104, the method further includes forming a first metal layer on the inner wall of the word line trenches. For example, the first metal layer may be titanium nitride (TiN) for an adhesion and barrier layer.

In one embodiment, the word line conductive material layer is formed by a plasma chemical vapor deposition process. In another embodiment, the word line conductive material layer is formed by a physical vapor deposition process. In one embodiment, the word line conductive material is a metal conductive material, such as a metal tungsten, a metal tungsten composite, a metal aluminum, and the like.

Figure 3A:
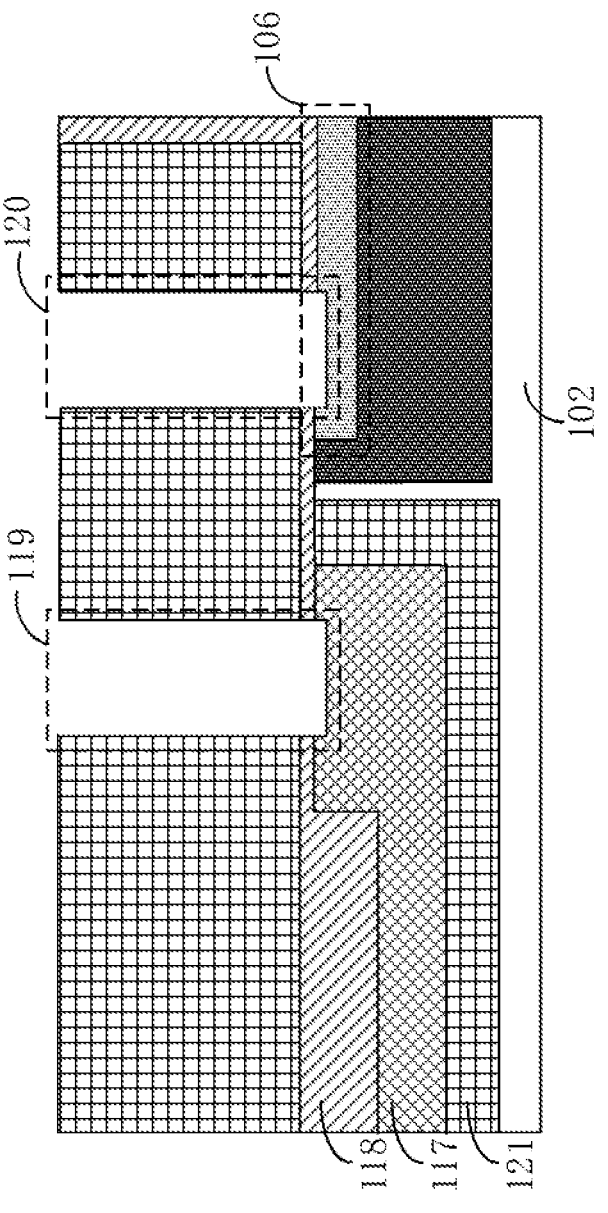
FIG. 3a is a cross-sectional view of the semiconductor device according to an embodiment.
Figure 3B:
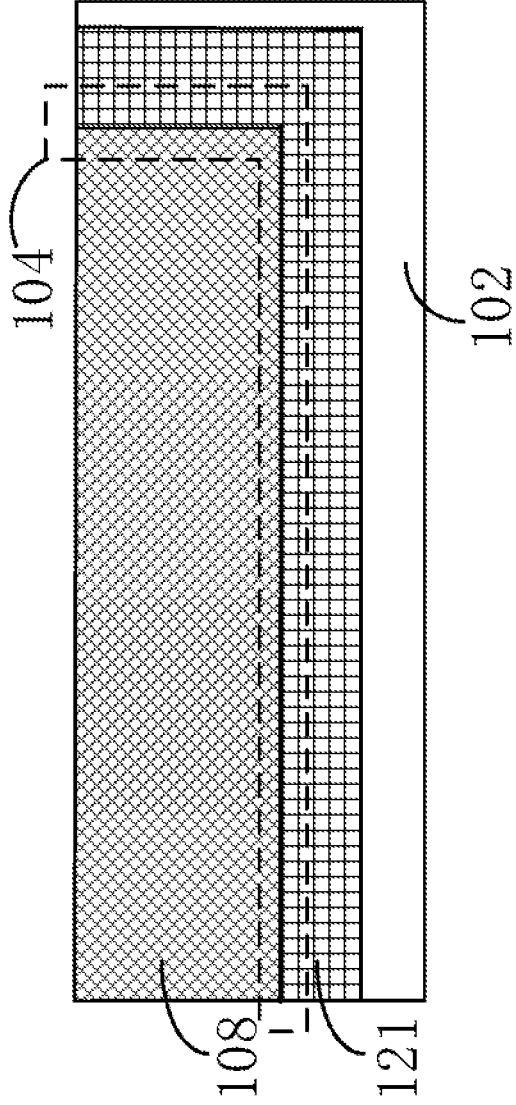
FIG. 3b is a cross-sectional view of the semiconductor device after the word line conductive layer is formed according to an embodiment.

In one embodiment, after removing the excess word line conductive material on the surface of the substrate, a word line conductive layer 108 is formed in the word line trenches 104 (FIG. 3b).

In one embodiment, the excess word line conductive material on the surface of the substrate is removed by chemical mechanical planarization process. In another embodiment, the excess word line conductive material on the surface of the substrate is removed by etching, such as wet etching, dry etching, and the like.

S108, forming a photoresist.

A photoresist 112 is formed on the surface of the substrate 102 (FIB. 4b), that is, a photoresist is photolithographically patterned on the surface of the substrate. The photoresist 112 overs the word line trenches 115 of the word line contact area 114 (FIG. 4b), that is, the word line contact holes, but exposes the word line trenches 116 which are outside the word line contact area 114, that is, the word line conductive layer which falls outside the word line contact area.

Specifically, the photoresist is coated on the surface of the substrate, and then is exposed and developed to open the word line conductive layer outside the word line contact area which is the array area of the device. The photoresist covering the word line contact area at the word line conductive layer is left unexposed and undeveloped, therefore the photoresist plays a role of protecting the word line contact holes in the word line conductive layer.

S110, forming a word line conductive structure.

By using the photoresist 112 as a barrier layer, the word line conductive layer that is not covered by photoresist post lithography development is etched to a target depth to obtain the word line conductive structure 117 (FIG. 3c), that is, the photoresist 112 acts as a barrier layer so the word line conductive structure 117 is obtained in the word line conductive layer 108, the thickness of the word line conductive structure of the word line contact area 114 is greater than the thickness of the word line conductive structure not protected by the photoresist 112. Therefore, etching the word line conductive layer 108 not covered by the photoresist to a target depth results in etching until the remaining word line conductive layer 108 is lower than the surface of the substrate by about S nanometers, as long as the remaining word line conductive layer 108 can avoid short circuits between word lines and bit lines or other contact windows.

S112, the photoresist is removed.

Remove the photoresist on the surface of the substrate.

Figure 3C:
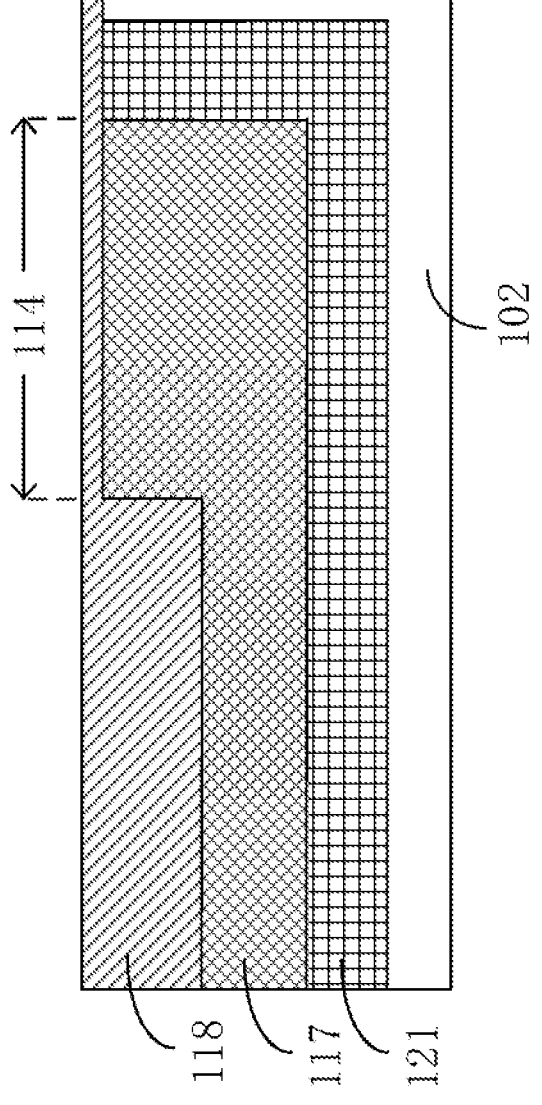
FIG. 3c is a cross-sectional view of the semiconductor device after forming an insulating dielectric layer according to an embodiment.

In one embodiment, the word line conductive structure 117 is located in the shallow trench isolation oxide layer 121 (FIG. 3c).

In one embodiment, the word line contact area 114 is located at the end of the word line conductive structure 117.

In one embodiment, the thickness ratio of the photoresist covered word line contact area to not-covered area is in the range greater than or equal to 1.5 to less than or equal to 4.0. In the actual process, the thickness ratio of the photoresist covered word line contact area to not-covered area can be set as required, such as 1.7, 1.9, 2.0, 2.2, 2.5, 2.7, 2.9, 3.0, 3.3, 3.5, 3.7, 3.9, etc.

Figure 1:
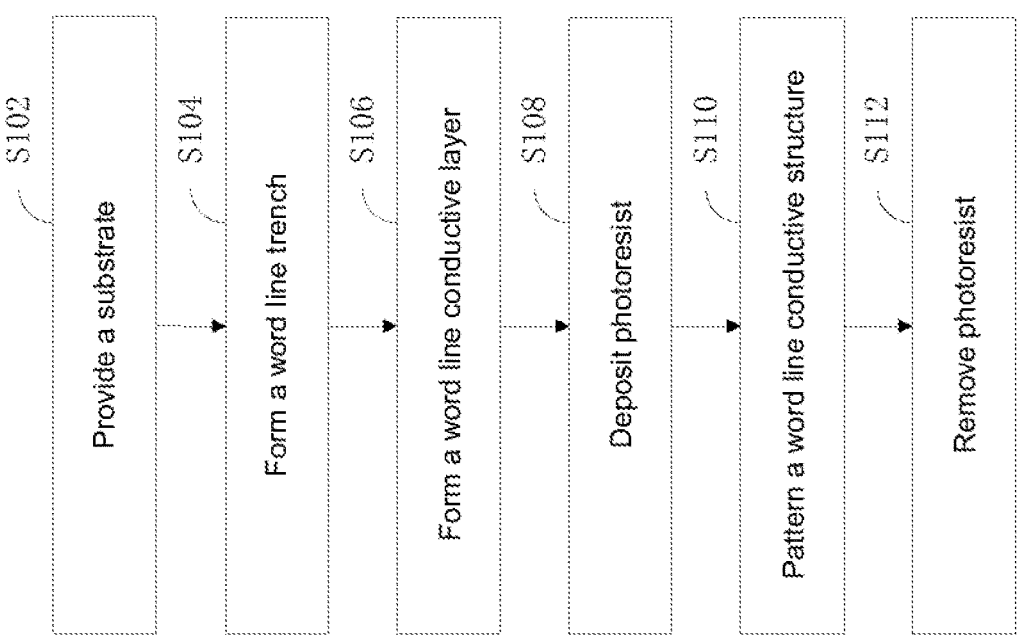
FIG. 1 is a flowchart of a method for manufacturing a semiconductor device according to an embodiment.
Figure 2A:
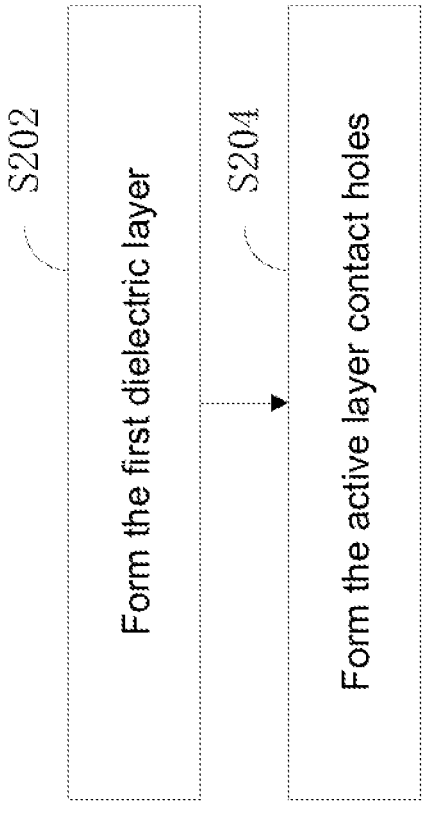
FIG. 2a is a flowchart of forming a word line contact hole according to an embodiment.

As shown in FIG. 2a, in one embodiment, after step S112, the method further includes:

S202, forming a first insulating dielectric layer.

A first insulating dielectric layer 151 is formed on the surface of the word line conductive structure 117.

In one embodiment, after removing the photoresist on the conductive structures of the word lines, a first insulating dielectric layer film is formed on the surface of the substrate, for example, physical vapor deposition or chemical vapor deposition may be applied on the surface of the substrate 102. A first insulating dielectric layer film is deposited; then, the excess first insulating dielectric layer film on the surface of the substrate is removed by etching or chemical mechanical polishing to form the first insulating dielectric layer 151.

In one embodiment, the first insulating dielectric layer 151 is a silicon oxide insulating layer.

S204, forming word line contact holes.

As shown in FIG. 3a, the first insulating dielectric layer 151 is patterned, and a word line contact hole 119 is formed in the word line contact area 114.

Figure 2B:
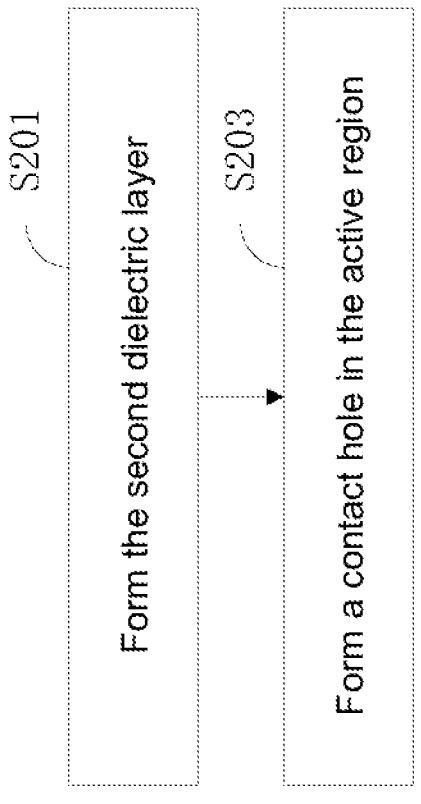
FIG. 2b is a flow chart of forming contact holes in the active area according to an embodiment.

As shown in FIG. 2b, in one embodiment, the substrate further includes a peripheral circuit area, the peripheral circuit area includes a transistor active area, and the manufacturing method of the semiconductor device further includes:

S201, forming a second insulating dielectric layer 161.

A second insulating dielectric layer 161 is formed on the surface of the active area of the transistor.

In one embodiment, the second insulating dielectric layer 151 and the first insulating dielectric layer 161 are formed by the similar process.

S203, forming an active area contact hole.

The second insulating dielectric layer 161 is patterned to form an active area contact hole 120 on the source/drain area 106 of the active area.

In one embodiment, the depth difference between the active area contact hole 120 and the word line contact hole 119 is greater than or equal to 0 and less than 20% of the total depth of the active area contact hole. In the actual process, the depth difference between the contact hole 120 in the active area and the contact hole 119 in the word line may be 5%, 7%, 9%, 10%, 13%, 15%, 17%, 19%, etc. of the depth of the active area contact hole.

In one embodiment, the word line contact hole 119 and the active area contact hole 120 are formed by the some process.

In one embodiment, the semiconductor device is a dynamic random access memory.

The above manufacturing method includes: providing a substrate, which includes a memory cell array area; forming word line trenches arranged with space in between in the memory cell array area; filling a conductive material into the word line trenches, forming a word line conductive layer 108; forming a photoresist on the surface of the substrate, the photoresist is patterned such that it is not exposed on the word line contact area of the word line conductive layer 108 so it acts as a barrier layer, but it is exposed outside the word line contact area of the word line conductive layer 108; and after photoresist development the word line conductive layer 108 that is no longer covered by the photoresist at etch time is etched to a target depth to obtain a conductive structure, so that the thickness at the word line contact area of the word line conductive structure is greater than the thickness of the other word line conductive structure. In this application, a photoresist is formed on the surface of the substrate. The photoresist is patterned to protect the word line contact area of the word line conductive layer 108 and exposes the word line conductive layer 108 outside the word line contact area. The word line conductive layer 108 that is not covered by the photoresist is etched to a target depth, so that the thickness of the word line conductive structure in the word line contact area of the formed word line conductive structure is greater than that of the word line conductive structure not protected by the photoresist. Compared with the same thickness of the word line conductive structure in the word line contact area protected by the photoresist and of the word line conductive structure not in the word line contact area not protected by the photoresist, the opening depth of the word line contact hole in the word line contact area is reduced. The depth of the window position reduces the process time in forming the contact hole, reduces the excessive erosion of the sidewall of the contact hole from a shallower opening depth in the contact hole process, thereby avoids the device short circuit caused by the abnormal contact hole.

As shown in FIG. 3a, FIG. 3b, and FIG. 3c, according an embodiment, a semiconductor device is provided, including:

A memory cell array region is formed on the substrate 102. A plurality of mutually independent word line trenches are arranged in the memory cell array area, and the word line trenches extend along a first direction and are arranged at intervals along a second direction. The first direction and the second direction intersect. The substrate may include one of silicon, silicon-on-insulator (SOI), stacked-silicon-on-insulator (SSOI), silicon-germanium-on-insulator (SSiGeOI), silicon-germanium on insulator (SiGeOI), germanium-on-insulator (GeOI), etc.

The word line conductive structure 117 includes the word line conductive structure of the word line contact area 114 and the word line conductive structure outside the word line contact area 114.

In one embodiment, the word line contact 114 is located at the end of the word line conductive structure 117.

In one embodiment, the word line conductive structure 117 is a metal conductive structure, such as a metal tungsten conductive structure, a metal tungsten composite conductive structure, a metal aluminum conductive structure, and the like.

The thickness of the word line conductive structure of the word line contact area 114 is greater than the thickness of the word line conductive structure outside the word line contact area 114.

In one embodiment, the thickness ratio of the word line contact area to outside word line contact area in the word line conductive structure is in the range of greater than or equal to 1.5 to less than or equal to 4.0. In the actual semiconductor device design process, the thickness ratio of the word line contact area to outside the word line contact area in the word line conductive structure is set as needed, such as 1.7, 1.9, 2.0, 2.2, 2.5, 2.7, 2.9, 3.0, 3.3, 3.5, 3.7, 3.9, etc.

In an embodiment, the device further includes:

The word line contact hole 119 is formed in the word line contact area 114 and the bottom of the word line contact hole 119 is in contact with the upper surface of the word line contact area 114.

The active area contact hole 120 is formed on the transistor active area and the bottom of the active area contact hole 120 is in contact with the upper surface of the source drain area 106 of the transistor.

In an embodiment, the device further includes:

A peripheral circuit area, the peripheral circuit area includes a transistor active area, and the active area has a source area/drain area 106.

The insulating dielectric layer 118 is located on the surface of the word line conductive structure and the active area.

In one embodiment, the insulating dielectric layer 118 includes a first insulating dielectric layer on the surface of the word line conductive structure 117 and a second insulating dielectric layer on the surface of the active region of the transistor.

The word line contact structure is located on the word line contact area 114 and is in contact with the word line contact area 114.

The word line contact structure is located in the word line contact hole 119 formed on the word line contact area 114, and the word line contact structure is a conductive structure for leading out the word line conductive structure 117.

In one embodiment, the word line contact structure is a metal conductive structure, made of such materials of metal tungsten, metal tungsten composite, metal aluminum, and the like.

The active region contact hole of the active region contact structure is located on the transistor active region and is in contact with the source region/drain region 106 of the transistor active region.

The active area contact structure is located in the active area contact hole 120 formed on the source area/drain area 106, and the active area contact structure is a conductive structure for leading out the source area/drain area 106 of the transistor.

In one embodiment, the active area contact structure is a metal conductive structure, composed of such materials as metal tungsten, metal tungsten composite, metal aluminum, and the like.

In one of the embodiments, the depth difference between the active area contact structure and the word line contact structure is greater than or equal to 0 and less than 20% of the depth of the active area contact structure. In actual semiconductor devices. The depth difference between the active area contact structure and the word line contact structure may be 5%, 7%,9%, 10%, 13%, 15%, 17%, 19%, etc. of the height of the active area contact structure.

In one embodiment, the depth difference between the active area contact hole 120 and the word line contact hole 119 is greater than or equal to 0 and less than 20% of the height of the active area contact hole. In actual semiconductor devices, the depth difference between the contact hole in the active area 120 and contact hole 119 in the word line may be 5%, 7%, 9%, 10%, 13%, 15%, 17%, 19%, etc. of the depth of the active area contact hole.

In one embodiment, the device further includes a first metal layer, the first metal layer is located in the word line trenches, an upper surface of the first metal layer is in contact with the lower surface of the word line conductive structure, for example, the first metal layer may be a titanium/titanium nitride metal layer for adhesion and as a barrier layer.

In one embodiment, the semiconductor device is a dynamic random access memory.

The semiconductor device described above includes: a substrate on which a memory cell array region is formed, and the memory cell array region formed with word line trenches arranged at intervals; a word line conductive structure including the structures of word line contact holes and the structure of outside the word line contact holes; wherein the thickness of the word line conductive structure in the word line contact hole is greater than the thickness of the word line conductive structure outside the word line contact area. The thickness of the word line conductive structure in the word line contact area is greater than the thickness of the word line conductive structure outside the word line contact area. Compared with a device having the same thickness in and outside the word line contact area, the opening depth of the word line contact hole is reduced, and the process time in forming the contact hole is reduced. In the process, excessive erosion of the sidewall of the contact hole having a shallow opening depth is avoided, and the device short circuit abnormality caused by the contact hole problem is avoided.

The technical features of the above-mentioned embodiments can be combined arbitrarily. In order to make the description concise, all possible combinations of the various technical features in the above-mentioned embodiments are not described. However, as long as there is no contradiction in the combination of these technical features.

The above-mentioned embodiments only express several embodiments of the present disclosure, and the descriptions are more specific and detailed, but they should not be understood as limiting the scope of the disclosure patent. It should be pointed out that for those of ordinary skill in the art, without departing from the concept of the present disclosure, several modifications and improvements can be made, and these all fall within the protection scope of the present disclosure. Therefore, the protection scope of the patent of the present disclosure should be subject to the appended claims.

The invention claimed is:

1. A method for manufacturing a semiconductor device, providing a substrate, wherein the substrate comprises a memory cell array area on a first surface and a peripheral circuit area, the peripheral circuit area comprises a transistor active area; forming word line trenches in the memory cell array area; filling the word line trenches with a word line conductive layer, wherein a surface of the word line conductive layer is flush with the first surface of the substrate; forming a photoresist layer on the first surface of the substrate, wherein the photoresist layer is patterned to protect a word line contact area of the word line conductive layer and to expose an area outside the word line contact area of the word line conductive layer;

etching the word line conductive layer to form a word line conductive structure, wherein the photoresist layer is used as a mask, the area outside the word line contact area of the word line conductive layer exposed by the photoresist layer is etched to a target depth, wherein the word line conductive structure comprises a first conductive structure located in the word line contact area and a second conductive structure located in the area outside the word line contact area, the first conductive structure of the word line conductive structure has a thickness greater than a thickness of the second conductive structure of the word line conductive structure, and a surface of the word line contact area is flush with the first surface of the substrate, a surface of the word line conductive structure is lower than the first surface of the substrate; removing the photoresist layer;

forming an insulating dielectric layer on the first surface of the substrate, wherein the insulating dielectric layer comprises a first insulating dielectric layer on the surface of the word line conductive structure and a second insulating dielectric layer on a surface of the transistor active area, wherein a surface of the first insulating dielectric layer is flush with a surface of the second insulating dielectric layer, the first insulating dielectric layer and the second insulating dielectric layer are formed by a same process; and patterning the first insulating dielectric layer and the second insulating dielectric layer, forming a word line contact hole in the word line contact area and forming an active area contact hole in the transistor active area.

2. The method of claim 1, wherein the word line contact area is located at an end of the word line conductive structure.

3. The method of claim 1, wherein the word line contact holes and the active area contact holes are formed in a same process.

4. A semiconductor device, comprising:

a substrate, a memory cell array area formed on the substrate, and word line trenches arranged in the memory cell array area and having an interval spaced in between each other;

a word line conductive structure, comprising a first conductive structure located in a word line contact area and a second conductive structure located in an area outside the word line contact area; wherein the first conductive structure of the word line conductive structure has a thickness greater than a thickness of the second conductive structure of the word line conductive structure;

wherein the substrate further comprises:

a peripheral circuit area, comprising a transistor active area;

an insulating dielectric layer, comprising a first insulating dielectric layer on a surface of the word line conductive structure and a second insulating dielectric layer on a surface of the transistor active area, wherein a surface of the first insulating dielectric layer is flush with a surface of the second insulating dielectric layer, the first insulating dielectric layer and the second insulating dielectric layer are formed by a same process;

a word line contact hole formed in the word line contact area; and an active area contact hole formed in the transistor active area.

5. The semiconductor device of claim 4, wherein the word line contact area is located at an end of the word line conductive structure.

6. The semiconductor device of claim 4, wherein a thickness ratio of the first conductive structure located in the word line contact area to the second conductive structure located in an area outside the word line contact area is in a range from 1.5 to 4.0.

7. The semiconductor device of claim 4, wherein the semiconductor device further comprises a word line contact structure located in the word line contact hole, the word line contact structure is formed on and in direct contact with the word line contact area.

8. The semiconductor device of claim 4, wherein the semiconductor device further comprises an active area contact structure located in the active area contact hole, the active area contact structure is formed on and in direct contact with a source area/a drain area of the transistor active area.

9. The method of claim 1, wherein a thickness ratio of the first conductive structure of the word line conductive structure to the second conductive structure of the word line conductive structure is in a range from 1.5 to 4.0.

* * * * *